(12) United States Patent
Mochizuki

(10) Patent No.: US 7,248,981 B2
(45) Date of Patent: Jul. 24, 2007

(54) JITTER MEASUREMENT DEVICE AND JITTER MEASUREMENT METHOD

(75) Inventor: Ken Mochizuki, Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 10/538,520

(22) PCT Filed: Oct. 29, 2004

(86) PCT No.: PCT/JP2004/016136

§ 371 (c)(1),
(2), (4) Date: Jun. 10, 2005

(87) PCT Pub. No.: WO2005/050230

PCT Pub. Date: Jun. 2, 2005

(65) Prior Publication Data

US 2006/0064258 A1    Mar. 23, 2006

(30) Foreign Application Priority Data

Nov. 20, 2003   (JP) .............................. 2003-390560

(51) Int. Cl.
*G01R 29/02*   (2006.01)
(52) U.S. Cl. .................. 702/69; 324/622; 375/226
(58) Field of Classification Search .................. 702/57, 702/66, 69, 70, 72, 79, 89, 106; 324/620–625; 375/226, 371
See application file for complete search history.

(56) References Cited

U.S. PATENT DOCUMENTS 6,460,001 B1 * 10/2002 Yamaguchi et al. .......... 702/69

(Continued)

FOREIGN PATENT DOCUMENTS

JP    2001-133492 A    5/2001

(Continued)

OTHER PUBLICATIONS

ITU-T, Telecommunication Standardization Sector of ITU; International Telecommunication Union; G. 825; Series G: Transmission Systems and Media Digital Systems and Networks; Mar. 2000; pp. 3-4.

*Primary Examiner*—Manuel L. Barbee
(74) *Attorney, Agent, or Firm*—Frishauf, Holtz, Goodman & Chick, P.C.

(57) ABSTRACT

An orthogonal signal generating unit converts a signal to be measured into two orthogonal signals which are two signals whose phases are orthogonal to one another. An instantaneous phase calculating unit calculates an instantaneous phase based on the two orthogonal signals within a range between a lower limit phase value set in advance and an upper limit phase value set in advance. A differential value detecting unit detects a differential value of the instantaneous phase. A differential value correcting unit corrects the differential value, and outputs a corrected differential value when the differential value of the instantaneous phase is over the range dependent on the lower limit phase value and the upper limit phase value. An offset component eliminating unit eliminates an offset component included in the corrected differential value from the corrected differential value output from the differential value correcting unit, and outputs a differential value from which the offset component has been eliminated. An integration unit determines a jitter amount of the signal to be measured by integrating the differential value which is output from the offset component eliminating unit, and from which the offset component has been eliminated.

26 Claims, 7 Drawing Sheets

U.S. PATENT DOCUMENTS 6,621,860 B1    9/2003  Yamaguchi et al.
6,687,629 B1    2/2004  Yamaguchi et al.
6,795,496 B1 *  9/2004  Soma et al. ............... 375/226

FOREIGN PATENT DOCUMENTS

WO    WO 00/46606 A1    8/2000

* cited by examiner

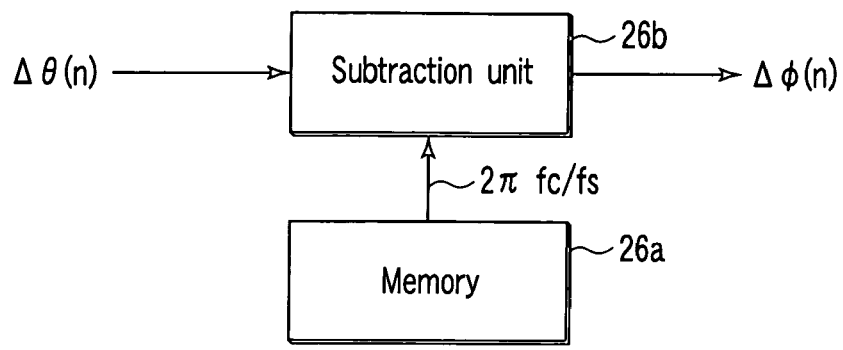
F I G. 3A
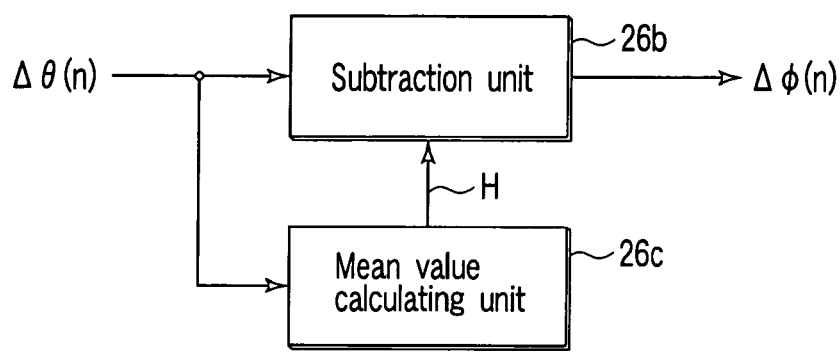
F I G. 3B
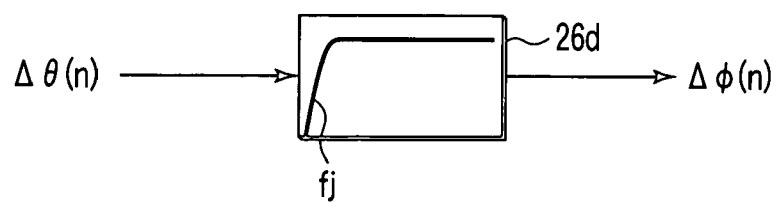
F I G. 3C

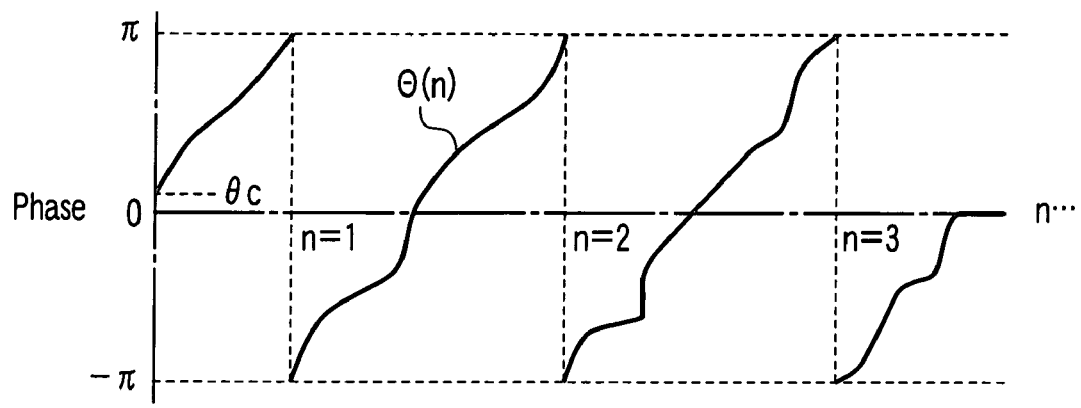
F I G. 4A
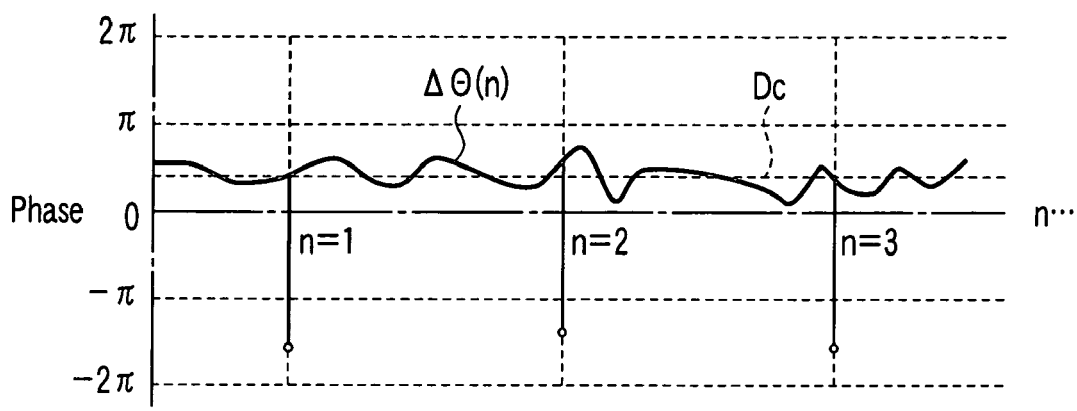
F I G. 4B
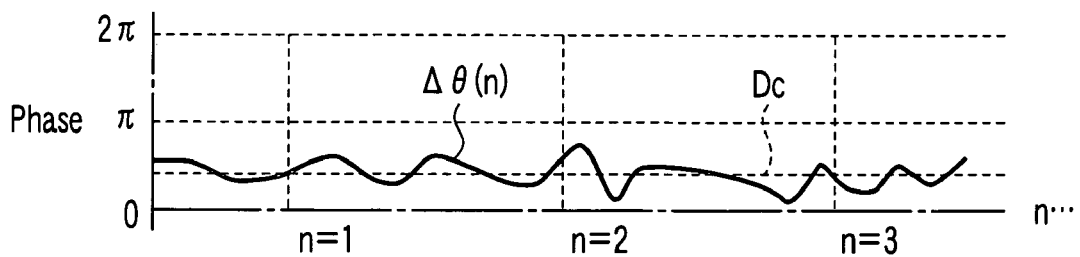
F I G. 4C

JITTER MEASUREMENT DEVICE AND JITTER MEASUREMENT METHOD

This application is a U.S. National Phase Application under 35 USC 371 of International Application PCT/JP2004/016136 filed Oct. 29, 2004.

TECHNICAL FIELD

The present invention relates to a jitter measuring apparatus and a jitter measuring method in which a digital computing technology for enabling measurement for a long time without reducing measurement resolution is used in a jitter measuring apparatus and a jitter measuring method for measuring jitter (phase noise) which has an effect on a signal to be measured, such as a digital signal, used for transmission of information in a communication network.

BACKGROUND ART

In a data transmission system, when a large jitter arises in a transmission signal, the signal cannot be correctly transmitted.

Therefore, it is necessary to measure the jitter which this type of data transmission system and the equipment constituting the system generate.

That is, in a digital transmission path for transmitting digital signals, the transmission path is extended by repeaters which reproduce and output digital signals. However, in using such repeaters, when phase fluctuation (jitter) in the input signal becomes large, the original signal cannot be reproduced.

Therefore, with respect to the maximum permissible level of jitter in an interface of a digital transmission path, the limit is prescribed in various international standards.

For example, with respect to the synchronous digital transmission network called Synchronous Optical Network/Synchronous Digital Hierarchy (SONET/SDH), the maximum permissible level of jitter is prescribed in the following non-Patent document 1.

Non-Patent document 1: ITU-T Recommendations G. 825 (March 2000). Therefore, in order to verify whether or not the jitter generated in the interface of this type of transmission path satisfies the above-described maximum permissible level, it is necessary to measure the jitter amount in advance.

As a conventional jitter measuring apparatus used for such an object, for example, as described in the following Patent document 1, an analog system jitter measuring apparatus in which, due to the phase of a signal to be measured (clock signal) being synchronized by using a phase-locked loop (PLL) circuit, a signal corresponding to the phase shift is detected as jitter has been known.

Patent document 1: Jpn. Pat. Appln. KOKAI Publication No. 2001-133492. In such an analog system jitter measuring apparatus, there is the problem that dispersion is brought about in a measured result of a jitter due to dispersion in the characteristics of parts used for the PLL circuit, and the reproducibility of a measured result of a jitter deteriorates due to environmental variation in temperature and the like.

Further, in an analog system jitter measuring apparatus as described above, there is the problem that a measurement range of jitter is limited by a linear operation range of a phase detector (PD) and a voltage controlled oscillator (VCO) which configuration the PLL circuit.

Therefore, in an analog system jitter measuring apparatus as described above, because the measurement resolution deteriorates when a sensitivity of a PD or a VCO is reduced in order to broaden the measurement range of jitter, there is a problem in the point that a high resolution and a broad measurement range cannot be compatible.

As a technology to solve these problems, a digital system jitter measuring apparatus and measuring method which carry out a detection of a phase error by arithmetic processing are proposed in the following Patent document 2.

Patent document 2: U.S. Pat. No. 6,621,860. FIG. 5 shows a configuration of a digital system jitter measuring apparatus 10 based on Patent document 2.

In this jitter measuring apparatus 10, by sampling a signal to be measured C by an analog-to-digital converter 11, the signal to be measured C is converted into a digital signal sequence x(n), and this digital signal sequence x(n) is input to an orthogonal signal generating unit 12.

Here, provided that a frequency of a signal to be measured is fc, an amplitude is Ac, a sampling frequency of analog-to-digital conversion is fs, and an initial phase is θc, and a jitter is φ (n), the signal sequence x(n) can be expressed as follows.

$$x(n)=Ac \cdot \cos [2\pi(fc/fs)n+\theta c+\phi(n)] \quad (1)$$

Where, (n=0,1,2, ... )

The orthogonal signal generating unit 12 includes a Hilbert transformer, and transforms the signal sequence x(n) of the signal to be measured C into two signals I(n), Q(n) whose phases are orthogonal to one another, and outputs these two orthogonal signals I(n), Q(n) to an instantaneous phase calculating unit 13.

Here, the two orthogonal signals I(n), Q(n) are expressed as follows with respect to the above-described signal sequence x(n).

$$I(n)=x(n)=Ac \cdot \cos [2\pi(fc/fs)n+\theta c+\phi(n)]$$

$$Q(n)=Ac \cdot \sin [2\pi(fc/fs)n+\theta c+\phi(n)] \quad (2)$$

The instantaneous phase calculating unit 13 calculates an instantaneous phase Θ(n) determined by the two orthogonal signals I(n), Q(n) output from the orthogonal signal generating unit 12, by the following operation, and outputs this instantaneous phase Θ(n) to a discontinuity correcting unit 14.

$$\Theta(n)=\tan^{-1} [Q(n)/I(n)] \quad (3)$$

Here, when the two orthogonal signals are expressed by the above formula (2), the instantaneous phase Θ(n) is expressed as follows.

$$\Theta(n) = \tan^{-1}[Q(n)/I(n)] \quad (4)$$
$$= 2\pi(fc/fs)n + \theta c + \phi(n)]$$

Here, the instantaneous phase Θ(n) determined by the operation of $\tan^{-1}$ [Q(n)/I(n)] is limited to a range from $-\pi$ to $\pi$, and for an increase in n, as shown in FIG. 6A, a variation is repeated in which after the instantaneous phase Θ(n) increases from a value close to an initial phase θc up to nearly π while receiving a fluctuation by the jitter, the instantaneous phase Θ(n) varies to nearly $-\pi$ discontinuously, and increases up to nearly π again.

As described in FIG. 6B, the discontinuity correcting unit 14 corrects the instantaneous phase Θ(n) which is output from the instantaneous phase calculating unit 13, and which varies discontinuously as described above into an instantaneous phase Θ(n) having continuity, and outputs the corrected instantaneous phase Θ(n) to a linear phase eliminating unit 15.

The linear phase eliminating unit 15 presumes a phase component 2π(fc/fs)n linearly increasing with respect to an increase in n and an initial phase θc in the corrected instantaneous phases θ(n) output from the discontinuity correcting unit 14, and determines a jitter component φ(n) as shown in FIG. 6C by subtracting the sum of those as a linear phase component L(n) from the instantaneous phases θ(n), and outputs this jitter component φ(n) to a jitter amount detecting unit 16.

The jitter amount detecting unit 16 detects a jitter amount of the signal to be measured C based on the jitter component φ(n) output from the linear phase eliminating unit 15.

This jitter amount is a maximum amplitude (p-p value) or a root-mean-square value (rms) of the jitter component φ(n), or an amplitude probability distribution (histogram), a spectrum value obtained by an FFT operation, or the like, and may be one of or a combination of those.

In this way, by means of a digital system jitter measuring apparatus which measures a jitter in a signal to be measured by numeric arithmetic processing, as compared with an analog system jitter measuring apparatus described above, there is no reduction in an measuring accuracy of jitter due to dispersion in the characteristics of parts or an environmental variation, and it is possible to measure a jitter with high reproducibility, and a broad measurement range and a high measurement resolution can be compatible by making a number of arithmetic bits large.

However, in a technique, as the digital system jitter measuring apparatus 10 described above, in which a jitter component φ(n) is determined by subtracting a linear phase component L(n) from an instantaneous phase θ(n), because the instantaneous phase θ(n) and the linear phase component L(n) which are signal components diverging as time passes are handled with, there is the problem that a maximum measurement time for jitter measurement is limited.

That is, this is because the instantaneous phase θ(n) having continuity and the linear phase component L(n) described above increase and diverge as a measurement time passes.

Accordingly, in the digital system jitter measuring apparatus 10 described above, because a maximum measurement time for jitter measurement is limited, there is a problem in the point that jitter measurement for a long time over the maximum measurement time cannot be carried out.

Specifically, the maximum measurement time for jitter measurement is limited according to a number of bits at the time of operating the instantaneous phase θ(n) which the discontinuity correcting unit 14 can output.

For example, when the number of bits at the time of operating the instantaneous phase θ(n) is set to 40 bits, provided that 2π(fc/fs) is expressed by 16 bits in a linear phase component included in the instantaneous phase Θ(n)

$L(n)=2\pi(fc/fs)n+\theta c,$ n is limited to a range which the remaining 24 bits can take.

In this case, given that a sampling frequency fs is 100 MHz, because the maximum measurement time for jitter measurement is limited to about 0.167 seconds which is (the maximum value of n)/fs, it is impossible to carry out jitter measurement for a time longer than it (for example, 10 seconds or more).

As described in the above-described Patent-document 2, this is originally derived from a technique which has been developed in order for the digital system jitter measuring apparatus 10 described above to clear a test time of about 0.1 seconds allocated per test item in a test of a very large scale integration (VLSI).

That is, the reason for that the maximum measurement time for jitter measurement is limited to about 0.167 seconds in the digital system jitter measuring apparatus 10 described above depends on that jitter measurement over a long time (for example, 10 seconds or more) is not supposed in this jitter measuring apparatus 10.

However, in jitter measurement in a communication equipment used for a digital system and a network, and the like, as described in the above-described non-Patent document 1, for example, a measurement time for verifying the level of jitter in an interface of a transmission path is prescribed to 60 seconds.

Given that the above-described n is expressed by 33 bits, measurement for 60 seconds due to this prescription is possible. However, in accordance therewith, because needs 49 bits as a result of adding 16 bits expressing the above-described 2π(fc/fs) are necessary as the number of bits of θ(n), there is a problem in the point that a hardware amount of an apparatus executing operations is made larger than the case of 40 bits described above.

Then, given that 2π(fc/fs) is expressed by 7 bits, and n is expressed by 33 bits, because 40 bits is sufficient as the number of bits of θ(n), jitter measurement for 60 seconds is possible as the hardware amount is the same as in the case of 40 bits.

However, in this case, there is a problem in the point that a phase accuracy (phase resolution) of a measured value deteriorates by an amount of 9 bits more than the above-described case of 49 bits.

Note that, in some cases, it is requested to carry out jitter measurement for a long time over several minutes or more, and moreover, one day or more.

Note that, in the case of the digital system jitter measuring apparatus 10 described above as well, a time for jitter measurement can be extended by reducing the resolution of the instantaneous phase θ(n). However, because there is a limit in that, and the measurement resolution is reduced, there is a problem in the point that a high resolution and a long time measurement cannot be compatible.

DISCLOSURE OF INVENTION

An object of the present invention is to solve these problems, and to provide a jitter measuring apparatus and a jitter measuring method in which a high resolution and long time measurement are compatible, and jitter measurement can be highly accurately carried out substantially without limiting a maximum measurement time.

In order to achieve the above object, according to a first aspect of the present invention, there is provided a jitter measuring apparatus comprising:

an orthogonal signal generating unit (22) which converts a signal to be measured into two orthogonal signals which are two signals whose phases are orthogonal to one another;

an instantaneous phase calculating unit (23) which calculates an instantaneous phase based on the two orthogonal signals converted by the orthogonal signal generating unit within a range between a lower limit phase value set in advance and an upper limit phase value set in advance;

a differential value detecting unit (24) which detects a differential value of the instantaneous phase calculated by the instantaneous phase calculating unit;

a differential value correcting unit (25) which corrects the differential value of the instantaneous phase, and which outputs a corrected differential value when the differential value of the instantaneous phase detected by the differential value detecting unit is over the range dependent on the lower limit phase value and the upper limit phase value;

an offset component eliminating unit (26) which eliminates an offset component included in the corrected differential value from the corrected differential value output by the differential value correcting unit, and which outputs a differential value from which the offset component has been eliminated; and an integration unit (27) which determines a jitter amount of the signal to be measured by integrating the differential value which is output by the offset component eliminating unit, and from which the offset component has been eliminated.

In order to achieve the above object, according to a second aspect of the present invention, there is provided the jitter measuring apparatus according to the first aspect, wherein a lower limit and an upper limit of the range dependent on the lower limit phase value and the upper limit phase value are respectively equal to or approximately equal to the lower limit phase value and the upper limit phase value.

In order to achieve the above object, according to a third aspect of the present invention, there is provided the jitter measuring apparatus according to the first or second aspect, wherein the differential value correcting unit has a discontinuous point detecting unit (25a) which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a continuity insuring unit (25b) which insures continuity of the differential value of the instantaneous phase by correcting a discontinuous point of the differential value of the instantaneous phase detected by the discontinuous point detecting unit with respect to the differential value of the instantaneous phase detected by the differential value detecting unit, and outputting the corrected differential value.

In order to achieve the above object, according to a fourth aspect of the present invention, there is provided the jitter measuring apparatus according to the first or second aspect, wherein the differential value correcting unit has a discontinuous point detecting unit (25a) which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a discontinuous point eliminating unit (25c) which eliminates the discontinuous point of the differential value of the instantaneous phase detected by the discontinuous point detecting unit with respect to the differential value of the instantaneous phase detected by the differential value detecting unit and outputs the eliminated differential value.

In order to achieve the above object, according to a fifth aspect of the present invention, there is provided the jitter measuring apparatus according to the first or second aspect, wherein the differential value correcting unit has a discontinuous point detecting unit (25a) which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a discontinuous point interpolating unit (25b) which substantially insures continuity of the differential value of the instantaneous phase by eliminating the discontinuous point of the differential value of the instantaneous phase detected by the discontinuous point detecting unit with respect to the differential value of the instantaneous phase detected by the differential value detecting unit and interpolating the eliminated portion and outputting the interpolated differential value.

In order to achieve the above object, according to a sixth aspect of the present invention, there is provided the jitter measuring apparatus according to the first aspect, wherein the offset component eliminating unit has a memory (26a) in which a value determined by an operation of $2\pi(fc/fs)$ showing the offset component is stored in advance when a frequency fc of the signal to be measured and a sampling frequency fs for sampling the signal to be measured have been already known, and a subtraction unit (26b) which subtracts the value showing the offset component stored in the memory from the corrected differential value output by the differential value correcting unit.

In order to achieve the above object, according to a seventh aspect of the present invention, there is provided the jitter measuring apparatus according to the first aspect, wherein the offset component eliminating unit has a mean value calculating unit (26c) which determines a mean value of the corrected differential value output by the differential value correcting unit as an offset component in advance when a frequency fc of the signal to be measured and a sampling frequency fs for sampling the signal to be measured have been unknown, and a subtraction unit (26b) which subtracts the mean value of the corrected differential value serving as the offset component determined by the mean value calculating unit from the corrected differential value output by the differential value correcting unit.

In order to achieve the above object, according to an eighth aspect of the present invention, there is provided the jitter measuring apparatus according to the first aspect, wherein, when a lower limit frequency fj of a jitter component which is an object to be detected is designated, the offset component eliminating unit includes a high pass filter (26d) which has a frequency equal to or approximately equal to the lower limit frequency fj of the jitter component which is the object to be detected as a cutoff frequency for eliminating the offset component from the corrected differential value output by the differential value correcting unit.

In order to achieve the above object, according to a ninth aspect of the present invention, there is provided the jitter measuring apparatus according to the first aspect, wherein, given that a digital signal sequence of the signal to be measured is x(n), a frequency and an amplitude of the signal to be measured are respectively fc and Ac, a sampling frequency for sampling the signal to be measured is fs, and an initial phase and a jitter of the signal to be measured are respectively θc and φ(n), n=0,1,2, . . . , and when I(n), Q(n) serving as the two orthogonal signals are respectively expressed by $I(n) = x(n) = Ac \cdot \cos[2\pi(fc/fs)n + \theta c + \phi(n)]$, $Q(n) = Ac \cdot \sin[2\pi(fc/fs)n + \theta c + \phi(n)]$, and Θ(n) serving as the instantaneous phase is expressed by $$\Theta(n) = \tan^{-1}[Q(n)/I(n)]$$
$$= 2\pi(fc/fs)n + \theta c + \phi(n),$$

the instantaneous phase calculating unit calculates Θ(n) serving as the instantaneous phase determined by an operation of the $\tan^{-1}[Q(n)/I(n)]$ within a range from $-\pi$ to $\pi$, or $-\pi/2$ to $\pi/2$ as a range between the lower limit phase value set in advance and the upper limit phase value set in advance.

In order to achieve the above object, according to a tenth aspect of the present invention, there is provided the jitter measuring apparatus according to the ninth aspect, wherein the differential value detecting unit calculates ΔΘ(n) serving as the differential value of the instantaneous phase calculated by the instantaneous phase calculating unit, by an operation of $$\Delta\Theta(n) = \Theta(n) - \Theta(n-1)$$
$$= 2\pi(fc/fs) + \phi(n) - \phi(n-1)$$

Where, Θ(n−1)=0, and here, 2π(fc/fs) is a constant and an offset component).

In order to achieve the above object, according to an eleventh aspect of the present invention, there is provided the jitter measuring apparatus according to the tenth aspect, wherein the differential value correcting unit carries out arithmetic processing of

| | |
|---|---|
| Δθ(n) = ΔΘ(n) | (−π ≦ ΔΘ(n) ≦ π), |
| Δθ(n) = ΔΘ(n) + 2π | (−π > ΔΘ(n)), |
| Δθ(n) = ΔΘ(n) − 2π | (ΔΘ(n) > π) |
| or | |
| Δθ(n) = ΔΘ(n) | (−π/2 ≦ ΔΘ(n) ≦ π/2), |
| Δθ(n) = ΔΘ(n) + π | (−π/2 > ΔΘ(n)), |
| Δθ(n) = ΔΘ(n) − π | (ΔΘ(n) > π/2) | with respect to ΔΘ(n) serving as the differential value of the instantaneous phase in order to calculate Δθ(n) serving as the corrected differential value corrected so as to insure continuity by correcting the discontinuous point of ΔΘ(n) serving as the differential value of the instantaneous phase calculated by the instantaneous phase calculating unit.

In order to achieve the above object, according to a twelfth aspect of the present invention, there is provided the jitter measuring apparatus according to the eleventh aspect, wherein the offset component eliminating unit eliminates the offset component 2π(fc/fs) from Δθ(n) serving as the corrected differential value corrected so as to insure the continuity by the differential value correcting unit, and outputs $\Delta\phi(n) = \phi(n) - \phi(n-1)$ as Δφ(n) serving as the differential value from which the offset component has been eliminated to the integration unit.

In order to achieve the above object, according to a thirteenth aspect of the present invention, there is provided the jitter measuring apparatus according to the twelfth aspect, wherein the integration unit carries out a following integration U(n)=ΣΔφ(i) (Where, the symbol Σ denotes the sum total of i=0,1,2, . . . , n, and here, provided that U(n) is theoretically expanded, it is made to be $U(n) = [\phi(0)-\phi(-1)] + [\phi(1)-\phi(0)] + [\phi(2)-\phi(1)] + \ldots + [\phi(n)-\phi(n-1)] = \phi(n) - \phi(n-1)$ with respect to Δφ(n) serving as the differential value which is output by the offset component eliminating unit, and from which the offset component has been eliminated, and here, given that φ(−1)=0, an integrated result U(n) is to express a jitter component φ(n) of the signal to be measured, and outputs the integrated result U(n) as the jitter component φ(n) of the signal to be measured.

In order to achieve the above object, according to a fourteenth aspect of the present invention, there is provided a jitter measuring method comprising:

a step of converting a signal to be measured into two orthogonal signals which are two signals whose phases are orthogonal to one another;

a step of calculating an instantaneous phase based on the two orthogonal signals converted by the step of converting into the two orthogonal signals within a range between a lower limit phase value set in advance and an upper limit phase value set in advance;

a step of detecting a differential value of the instantaneous phase calculated by the step of calculating the instantaneous phase;

a step of correcting the differential value of the instantaneous phase, and outputting a corrected differential value when the differential value of the instantaneous phase detected by the step of detecting the differential value of the instantaneous phase is over the range dependent on the lower limit phase value and the upper limit phase value;

a step of eliminating an offset component included in the corrected differential value from the corrected differential value output by the step of correcting the differential value of the instantaneous phase, and outputting a differential value from which the offset component has been eliminated; and a step of determining a jitter amount of the signal to be measured by integrating the differential value which is output by the step of eliminating the offset component, and from which the offset component has been eliminated.

In order to achieve the above object, according to a fifteenth aspect of the present invention, there is provided the jitter measuring method according to the fourteenth aspect, wherein a lower limit and an upper limit of the range dependent on the lower limit phase value and the upper limit phase value are respectively equal to or approximately equal to the lower limit phase value and the upper limit phase value.

In order to achieve the above object, according to a sixteenth aspect of the present invention, there is provided the jitter measuring method according to the fourteenth or fifteenth aspect, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of insuring continuity of the differential value of the instantaneous phase by correcting the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and outputting the corrected differential value.

In order to achieve the above object, according to a seventeenth aspect of the present invention, there is provided the jitter measuring method according to the fourteenth or fifteenth aspect, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of eliminating the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and outputting the eliminated differential value.

In order to achieve the above object, according to an eighteenth aspect of the present invention, there is provided the jitter measuring method according to the fourteenth or fifteenth aspect, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of substantially insuring continuity of the differential value of the instantaneous phase by eliminating the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and interpolating the eliminated portion, and outputting the interpolated differential value.

In order to achieve the above object, according to a nineteenth aspect of the present invention, there is provided the jitter measuring method according to the fourteenth aspect, wherein the step of eliminating the offset component has a step of storing a value determined by an operation of $2\pi(fc/fs)$ showing the offset component in a memory in advance when a frequency fc of the signal to be measured and a sampling frequency fs for sampling the signal to be measured have been already known, and a step of subtracting the value showing the offset component stored in the memory from the corrected differential value output by the step of correcting the differential value of the instantaneous phase.

In order to achieve the above object, according to a twentieth aspect of the present invention, there is provided the jitter measuring method according to the fourteenth aspect, wherein the step of eliminating the offset component has a step of determining a mean value of the corrected differential value output by the step of correcting the differential value of the instantaneous phase as an offset component in advance when a frequency fc of the signal to be measured and a sampling frequency fs for sampling the signal to be measured have been unknown, and a step of subtracting the mean value of the corrected differential value serving as the offset component determined by the step of determining the mean value of the corrected differential value, from the corrected differential value output by the step of correcting the differential of the instantaneous phase.

In order to achieve the above object, according to a twenty-first aspect of the present invention, there is provided the jitter measuring method according to the fourteenth aspect, wherein, when a lower limit frequency fj of a jitter component which is an object to be detected is designated, the step of eliminating the offset component uses a high pass filter which has a frequency equal to or approximately equal to the lower limit frequency fj of the jitter component which is the object to be detected as a cutoff frequency for eliminating the offset component from the corrected differential value output by the step of correcting the differential value of the instantaneous phase.

In order to achieve the above object, according to a twenty-second aspect of the present invention, there is provided the jitter measuring method according to the fourteenth aspect, wherein, given that a digital signal sequence of the signal to be measured is x(n), a frequency and an amplitude of the signal to be measured are respectively fc and Ac, a sampling frequency for sampling the signal to be measured is fs, and an initial phase and a jitter of the signal to be measured are respectively θc and φ(n), n=0,1,2, . . . , and when I(n), Q(n) serving as the two orthogonal signals are respectively expressed by $I(n)=x(n)=Ac\cdot\cos [2\pi(fc/fs)n+\theta c+\phi(n)],$ $Q(n)=Ac\cdot\sin [2\pi(fc/fs)n+\theta c+\phi(n)],$ and Θ(n) serving as the instantaneous phase is expressed by $$\Theta(n) = \tan^{-1}[Q(n)/I(n)]$$
$$= 2\pi(fc/fs)n + \theta c + \phi(n),$$

the step of calculating the instantaneous phase calculates Θ(n) serving as the instantaneous phase determined by an operation of the $\tan^{-1} [Q(n)/I(n)]$ within a range from $-\pi$ to $\pi$, or $-\pi/2$ to $\pi/2$ as a range between the lower limit phase value set in advance and the upper limit phase value set in advance.

In order to achieve the above object, according to a twenty-third aspect of the present invention, there is provided the jitter measuring method according to the twenty-second aspect, wherein the step of detecting the differential value of the instantaneous phase calculates ΔΘ(n) serving as the differential value of the instantaneous phase calculated by the step of calculating the instantaneous phase, by an operation of $$\Delta\Theta(n) = \Theta(n) - \Theta(n-1)$$
$$= 2\pi(fc/fs) + \phi(n) - \phi(n-1)$$

Where, Θ(n−1)=0, and here, 2π(fc/fs) is a constant and an offset component).

In order to achieve the above object, according to a twenty-fourth aspect of the present invention, there is provided the jitter measuring method according to the twenty-third aspect, wherein the step of correcting the differential value of the instantaneous phase carries out arithmetic processing of

| | |
|---|---|
| Δθ(n) = ΔΘ(n) | (−π ≦ ΔΘ(n) ≦ π), |
| Δθ(n) = ΔΘ(n) + 2π | (−π > ΔΘ(n)), |
| Δθ(n) = ΔΘ(n) − 2π | (ΔΘ(n) > π) |
| or | |
| Δθ(n) = ΔΘ(n) | (−π/2 ≦ ΔΘ(n) ≦ π/2), |
| Δθ(n) = ΔΘ(n) + π | (−π/2 > ΔΘ(n)), |
| Δθ(n) = ΔΘ(n) − π | (ΔΘ(n) > π/2) | with respect to ΔΘ(n) serving as the differential value of the instantaneous phase in order to calculate Δθ(n) serving as the corrected differential value corrected so as to insure continuity by correcting a discontinuous point of ΔΘ(n) serving as the differential value of the instantaneous phase calculated by the step of calculating the instantaneous phase.

In order to achieve the above object, according to a twenty-fifth aspect of the present invention, there is provided the jitter measuring method according to the twenty-fourth aspect, wherein the step of eliminating the offset component eliminates the offset component 2π(fc/fs) from Δθ(n) serving as the corrected differential value corrected so as to insure the continuity by the step of correcting the differential value, and outputs $$\Delta\phi(n) = \phi(n) - \phi(n-1)$$

as Δφ(n) serving as the differential value from which the offset component has been eliminated.

In order to achieve the above object, according to a twenty-sixth aspect of the present invention, there is provided the jitter measuring method according to the twenty-fifth aspect, wherein the step of integrating the differential value from which the offset component has been eliminated carries out a following integration U(n)=ΣΔφ(i) (Where, the symbol Σ denotes the sum total of i=0,1,2, . . ., n, and here, provided that U(n) is theoretically expanded, it is made to be $$U(n)=[\phi(0)-\phi(-1)]+[\phi(1)-\phi(0)]+[\phi(2)-\phi(1)]+ \ldots + [\phi(n)-\phi(n-1)]=\phi(n)-\phi(-1)$$

with respect to Δφ(n) serving as the differential value which is output by the step of eliminating the offset component, and from which the offset component has been eliminated, and here, given that φ(−1)=0, an integrated result U(n) is to express a jitter component φ(n) of the signal to be measured, and outputs the integrated result U(n) as the jitter component φ(n) of the signal to be measured.

In this way, in the jitter measuring apparatus and the jitter measuring method according to the present invention, an instantaneous phase is determined within a predetermined range based on two orthogonal signals into which a signal to be measured is orthogonally transformed, and a differential value of the instantaneous phase is detected, and when the differential value of the instantaneous phase is over the predetermined range, a predetermined correction such as, for example, insuring the continuity, or the like, is carried out, and an offset component is eliminated from the differential value onto which the predetermined correction such as insuring the continuity or the like has been carried out, and a jitter component of the signal to be measured is determined by integrating the differential value from which the offset component has been eliminated.

Therefore, in the jitter measuring apparatus and the jitter measuring method according to the present invention, as a number of arithmetic bits at the respective portions and the respective stages, a number of arithmetic bits (for example, 16+1 bits) for obtaining a differential value with a necessary accuracy within a range double the predetermined range when an instantaneous phase is determined is sufficient, and moreover, jitter measurement over a long time which is, for example, several minutes or more is possible without limiting to the number of arithmetic bits, and substantially, without limiting a maximum measurement time for jitter measurement.

BRIEF DESCRIPTION OF DRAWINGS

FIG. 3A is a block diagram showing one example of an offset component eliminating unit in the embodiment of FIG. 1.

FIG. 3B is a block diagram showing another example of the offset component eliminating unit in the embodiment of FIG. 1.

FIG. 3C is a block diagram showing yet another example of the offset component eliminating unit in the embodiment of FIG. 1.

FIG. 4A is a signal waveform chart shown in order to explain operations of the jitter measuring apparatus and the jitter measuring method according to the embodiment of FIG. 1.

FIG. 4B is a signal waveform chart shown in order to explain operations of the jitter measuring apparatus and the jitter measuring method according to the embodiment of FIG. 1.

FIG. 4C is a signal waveform chart shown in order to explain operations of the jitter measuring apparatus and the jitter measuring method according to the embodiment of FIG. 1.

BEST MODE FOR CARRYING OUT THE INVENTION

Hereinafter, an embodiment of a jitter measuring apparatus and a jitter measuring method according to the present invention will be described based on the drawings.

Figure 1:
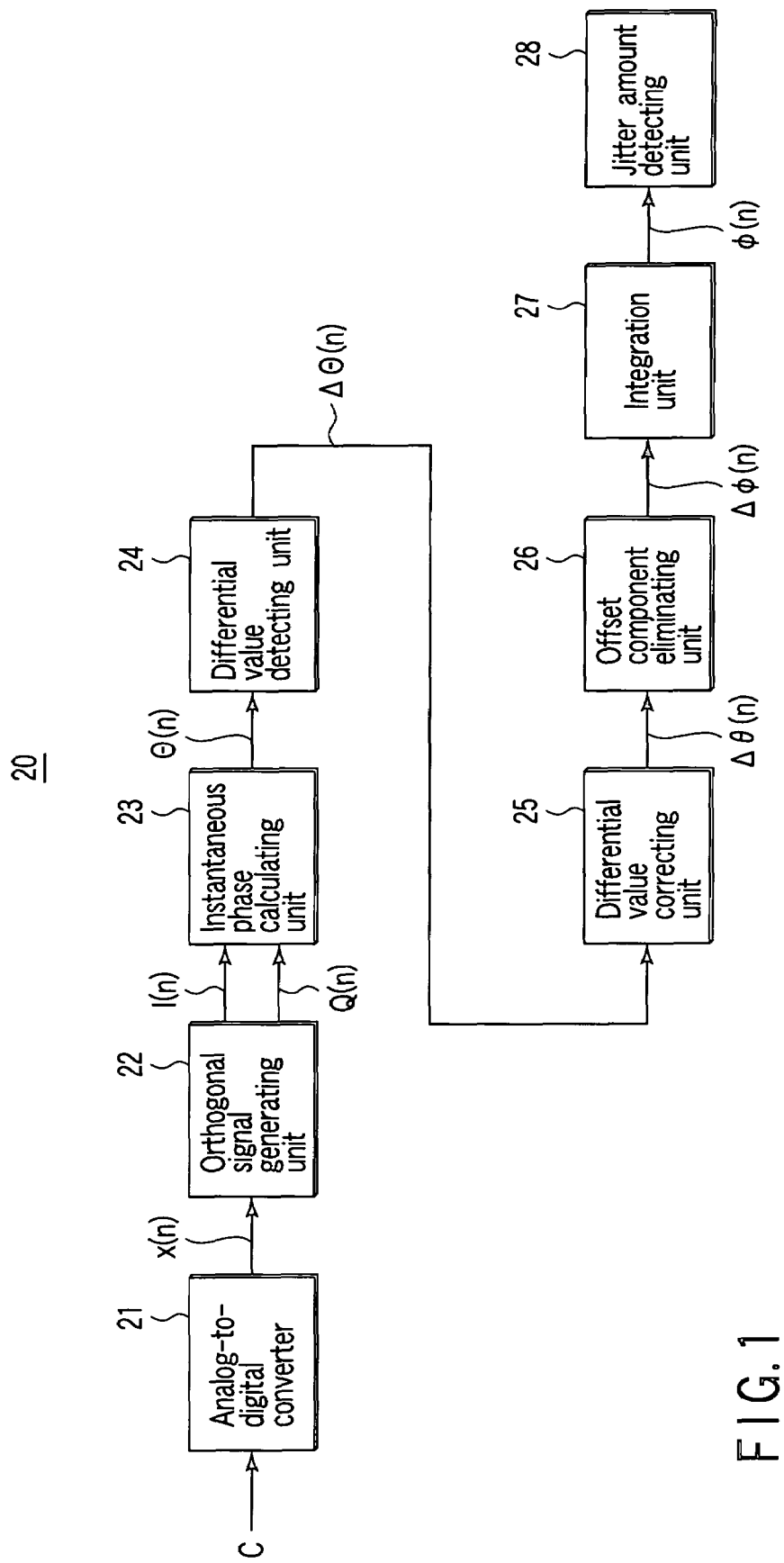
FIG. 1 is a block diagram showing a configuration of an embodiment of a jitter measuring apparatus to which a jitter measuring apparatus and a jitter measuring method according to the present invention is applied.

FIG. 1 shows a configuration of an embodiment of a jitter measuring apparatus 20 to which the jitter measuring apparatus and the jitter measuring method according to the present invention are applied.

As the basic configuration, the jitter measuring apparatus according to the present invention includes: an orthogonal signal generating unit 22 which converts a signal to be measured C into two orthogonal signals I(n), Q(n) which are two signals whose phases are orthogonal to one another; an instantaneous phase calculating unit 23 which calculates an instantaneous phase $\Theta(n)$ based on the two orthogonal signals I(n), Q(n) converted by the orthogonal signal generating unit 22 within a range between a lower limit phase value set in advance (for example, $-\pi$ or $-\pi/2$) and an upper limit phase value set in advance (for example, $\pi$ or $\pi/2$); a differential value detecting unit 24 which detects a differential value $\Delta\Theta(n)$ of the instantaneous phase $\Theta(n)$ calculated by the instantaneous phase calculating unit 23; a differential value correcting unit 25 which corrects the differential value $\Delta\Theta(n)$ of the instantaneous phase, and which outputs a corrected differential value $\Delta\theta(n)$ when the differential value $\Delta\Theta(n)$ of the instantaneous phase detected by the differential value correcting unit 24 is over a range (for example, from $-\pi$ to $\pi$, or from $-\pi/2$ to $\pi/2$) dependent on the lower limit phase value (for example, $-\pi$ or $-\pi/2$) and the upper limit phase value (for example, $\pi$ or $\pi/2$); an offset component eliminating unit 26 which eliminates an offset component Dc included in the corrected differential value $\Delta\theta(n)$ from the corrected differential value $\Delta\theta(n)$ output by the differential value correcting unit 25, and which outputs a differential value $\Delta\phi(n)$ from which the offset component Dc is eliminated; and an integration unit 27 which determines a jitter amount $\phi(n)$ of the signal to be measured C by integrating the differential value $\Delta\phi(n)$ which is output by the offset component eliminating unit 26, and from which the offset component Dc has been eliminated.

As the basic configuration, the jitter measuring method according to the present invention includes: a step of converting a signal to be measured into two orthogonal signals I(n), Q(n) which are two signals whose phases are orthogonal to one another; a step of calculating an instantaneous phase $\Theta(n)$ based on the two orthogonal signals I(n), Q(n) converted by the step of converting into two orthogonal signals I(n), Q(n) within a range between a lower limit phase value set in advance (for example, $-\pi$ or $-\pi/2$) and an upper limit phase value set in advance (for example, $\pi$ or $\pi/2$); a step of detecting a differential value $\Delta\Theta(n)$ of the instantaneous phase $\Theta(n)$ calculated by the step of calculating an instantaneous phase $\Theta(n)$; a step of correcting the differential value $\Delta\Theta(n)$ of the instantaneous phase, and outputting a corrected differential value $\Delta\theta(n)$ when a differential value $\Delta\Theta(n)$ of the instantaneous phase $\theta(n)$ detected by the step of detecting a differential value $\Delta\Theta(n)$ of the instantaneous phase $\theta(n)$ is over a range (for example, from $-\pi$ to $\pi$, or from $-\pi/2$ to $\pi/2$) dependent on the lower limit phase value (for example, $-\pi$ or $-\pi/2$) and the upper limit phase value (for example, $\pi$ or $\pi/2$); a step of eliminating an offset component Dc included in the corrected differential value $\Delta\theta(n)$ from the corrected differential value $\Delta\theta(n)$ output by the step of correcting a differential value $\Delta\Theta(n)$ of the instantaneous phase, and outputting a differential value $\Delta\phi(n)$ from which the offset component Dc is eliminated; and a step of determining a jitter amount $\phi(n)$ of the signal to be measured C by integrating the differential value $\Delta\phi(n)$ which is output by the step of eliminating an offset component Dc, and from which the offset component Dc has been eliminated.

In the above description, a case is included in which the lower limit and the upper limit of the range dependent on the lower limit phase value and the upper limit phase value are respectively made equal to or approximately equal to the lower limit phase value and the upper limit phase value.

Specifically, in the jitter measuring apparatus 20 according to the present embodiment shown in FIG. 1, an analog-to-digital converter 21 and the orthogonal signal generating unit 22 are equal to the analog-to-digital converter 11 and the orthogonal signal generating unit 12 of the conventional jitter measuring apparatus 10 described above.

That is, the analog-to-digital converter 21 converts an analog signal to be measured C into a digital signal sequence x(n) by sampling thereof, and outputs the digital signal sequence x(n) to the orthogonal signal generating unit 22.

Here, in the same way as the case of the conventional jitter measuring apparatus 10 described above, provided that a frequency and an amplitude of the signal to be measured C are respectively fc and Ac, a sampling frequency of the analog-to-digital converter 21 is fs, and an initial phase and a jitter of the signal to be measured C are respectively $\theta c\phi(n)$, the signal sequence x(n) can be expressed by the formula (1) described above.

The orthogonal signal generating unit 22 includes a Hilbert transformer, and converts the signal sequence x(n) of the signal to be measured C output from the analog-to-digital converter 21 into two orthogonal signals I(n), Q(n) expressed by the formula (2) described above, and outputs these two orthogonal signals I(n), Q(n) to the instantaneous phase calculating unit 23.

The instantaneous phase calculating unit 23 determines an instantaneous phase $\Theta(n)$ determined based on the aforementioned two orthogonal signals I(n), Q(n) output from the orthogonal signal generating unit 22, within a range (for example, a predetermined range from −π to π) between a lower limit phase value set in advance (for example, −π) and an upper limit phase value set in advance (for example, π) by the formula (3) described above, and outputs this instantaneous phase Θ(n) to the differential value detecting unit 24.

The differential value detecting unit 24 detects a differential value ΔΘ(n) of the instantaneous phase Θ(n) output from the differential value detecting unit 24, and outputs this differential value ΔΘ(n) of the instantaneous phase Θ(n) to the differential value correcting unit 25.

$$\Delta\Theta(n)=\Theta(n)-\Theta(n-1) \quad (5)$$

Where, Θ(n−1)=0

Here, a theoretical value of ΔΘ(n) is expressed as follows.

$$\begin{aligned}\Delta\Theta(n) &= \Theta(n) - \Theta(n-1) \quad (6)\\&= [2\pi(fc/fs)n + \theta c + \phi(n)]\\&\quad= [2\pi(fc/fs)(n-1) + \theta c + \phi(n-1)]\\&= 2\pi(fc/fs) + \phi(n) - \phi(n-1)\end{aligned}$$

2π(fc/fs) in the above formula (6) is a constant (such as an offset component).

The differential value correcting unit 25 detects a discontinuous point of the differential value ΔΘ(n) of the instantaneous phase Θ(n) by carrying out the following arithmetic processing with respect to the differential value ΔΘ(n) of the instantaneous phase Θ(n) output by the differential value detecting unit 24, and outputs a differential value Δθ(n) to which a predetermined correction with respect to the discontinuous point is applied, for example, which has been corrected so as to insure the continuity, to the offset component eliminating unit 26.

| | | (7) |
|---|---|---|
| Δθ(n) = ΔΘ(n) | (−π ≦ ΔΘ(n) ≦ π) | |
| Δθ(n) = ΔΘ(n) + 2π | (−π > ΔΘ(n)) | |
| Δθ(n) = ΔΘ(n) − 2π | (ΔΘ(n) > π) | |

Figure 2A:
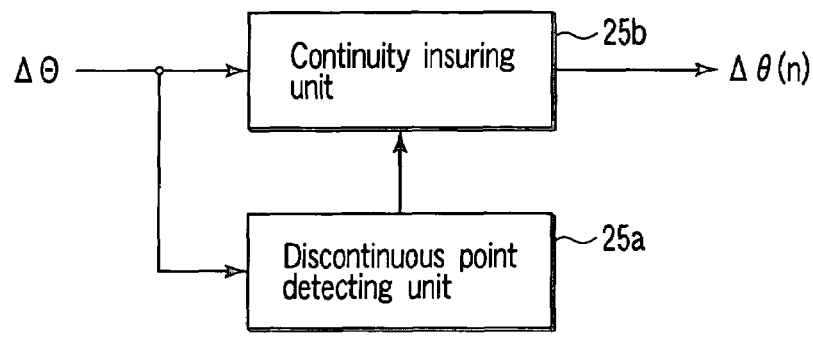
FIG. 2A is a block diagram showing one example of a differential value correcting unit in the embodiment of FIG. 1.

FIG. 2A is a block diagram showing one example of the differential value correcting unit 25.

This differential value correcting unit 25 has a discontinuous point detecting unit 25a which detects the differential value of the instantaneous phase as a discontinuous point of the differential value of the instantaneous phase when the differential value of the instantaneous phase detected by the differential value detecting unit 24 is over the range dependent on the lower limit phase value and the upper limit phase value, and a continuity insuring unit 25b which insures the continuity of the differential value of the instantaneous phase by correcting the discontinuous point of the differential value of the instantaneous phase detected by the discontinuous point detecting unit 25a, and by outputting the differential value of the instantaneous phase detected by the differential value detecting unit 24.

Figure 2B:
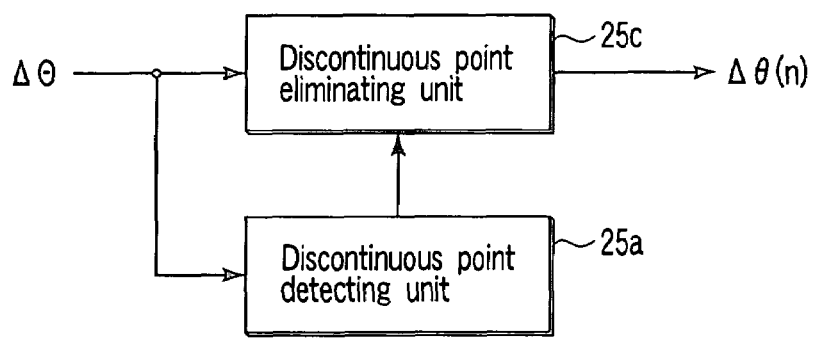
FIG. 2B is a block diagram showing another example of the differential value correcting unit in the embodiment of FIG. 1.

FIG. 2B is a block diagram showing another example of the differential value correcting unit 25.

This differential value correcting unit 25 has the discontinuous point detecting unit 25a which detects the differential value of the instantaneous phase as a discontinuous point of the differential value of the instantaneous phase when the differential value of the instantaneous phase detected by the differential value detecting unit 24 is over the range dependent on the lower limit phase value and the upper limit phase value, and a discontinuous point eliminating unit 25c which eliminates the discontinuous point of the differential value of the instantaneous phase detected by the discontinuous point detecting unit 25a with respect to the differential value of the instantaneous phase detected by the differential value detecting unit 24, and outputs the eliminated differential value.

Figure 2C:
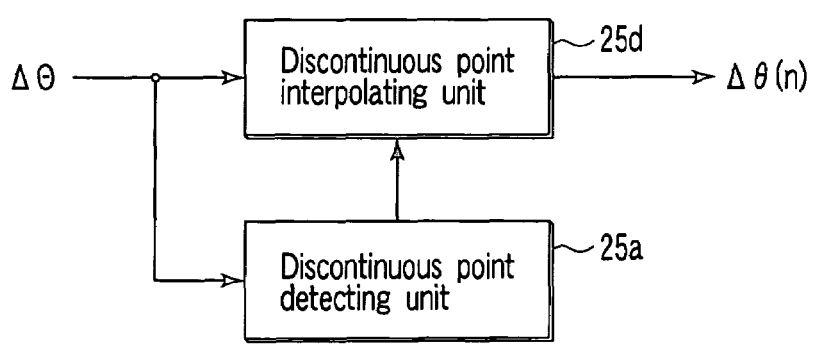
FIG. 2C is a block diagram showing yet another example of the differential value correcting unit in the embodiment of FIG. 1.

FIG. 2C is a block diagram showing yet another example of the differential value correcting unit 25.

This differential value correcting unit 25 has the discontinuous point detecting unit 25a which detects the differential value of the instantaneous phase as a discontinuous point of the differential value of the instantaneous phase when the differential value of the instantaneous phase detected by the differential value detecting unit 24 is over the range dependent on the lower limit phase value and the upper limit phase value, and a discontinuous point interpolating unit 25d which substantially insures the continuity of the differential value of the instantaneous phase by eliminating the discontinuous point of the differential value of the instantaneous phase detected by the discontinuous point detecting unit 25a, with respect to the differential value of the instantaneous phase detected by the differential value detecting unit 24, and by interpolating the eliminated portion and outputting the interpolated differential value.

The offset component eliminating unit 26 eliminates an offset component Dc from a differential value Δθ(n) corrected, for example, so as to insure the continuity of the differential value by the differential value correcting unit 25, and outputs the differential value Δφ(n) from which the offset component Dc has been eliminated to the integration unit 27.

Here, because the theoretical value of the offset component Dc is 2π(fc/fs), a theoretical value of the differential value Δφ(n) is to be $$\Delta\phi(n)=\phi(n)-\phi(n-1) \quad (8)$$

FIG. 3A is a block diagram showing one example of the offset component eliminating unit 26.

This offset component eliminating unit 26 has a memory 26a in which a value determined by an operation of 2π(fc/fs) showing the offset component is stored in advance of jitter measurement when a frequency fc of the signal to be measured C and a sampling frequency fs for sampling the signal to be measured C have been already known, and a subtraction unit 26b which subtracts the value showing the offset component stored in this memory 26a from the corrected differential value output by the differential value correcting unit 25 at the time of jitter measurement.

FIG. 3B is a block diagram showing another example of the offset component eliminating unit 26.

This offset component eliminating unit 26 has a mean value calculating unit 26c which determines a mean value of the corrected differential value output by the differential value correcting unit 25 as an offset component in advance of jitter measurement when a frequency fc of the signal to be measured C and a sampling frequency fs for sampling the signal to be measured C have been unknown, and the subtraction unit 26b which subtracts the mean value of the corrected differential value as the offset component determined by the mean value calculating unit 26c from the corrected differential value output by the differential value correcting unit 25 at the time of jitter measurement.

FIG. 3C is a block diagram showing yet another example of the offset component eliminating unit 26.

This offset component eliminating unit 26 is configured so as to include a high pass filter 26*d* which has a frequency equal to or approximately equal to the lower limit frequency fj of the jitter component which is the object to be detected as a cutoff frequency for eliminating the offset component from the corrected differential value output from the differential value correcting unit 25 when a lower limit frequency fj of a jitter component which is an object to be detected is designated in advance.

The integration unit 27 carries out the following integration with respect to the differential value Δϕ(n) which is output by the offset component eliminating unit 26, and from which the offset component Dc has been eliminated, and outputs the integrated result U(n) as a jitter component ϕ(n) of the signal to be measured C to the jitter amount detecting unit 28.

$$U(n) = \Sigma \Delta \phi(i) \qquad (9)$$

Where, the symbol Σ denotes the sum total of i=0,1, 2, . . . , n.

Provided that U(n) is theoretically expanded, it is $$\begin{aligned} U(n) &= [\phi(0) - \phi(-1)] \\ &+ [\phi(1) - \phi(0)] \\ &+ [\phi(2) - \phi(1)] \\ &+ \ldots \\ &+ [\phi(n) - \phi(n-1)] \\ &= \phi(n) - \phi(n-1) \end{aligned}$$

Here, given that ϕ(n−1)=0, the integrated result U(n) expresses a jitter component ϕ(n) of the signal to be measured C.

The jitter amount detecting unit 28 determines, with respect to a jitter component ϕ(n) output from the integration unit 27, a maximum amplitude (p-p value), a root-mean-square value (rms), an amplitude probability distribution (histogram) a spectrum by an FFT, or the like of the jitter component ϕ(n), in the same way as the jitter amount detecting unit 16 of the conventional jitter measuring apparatus 10 described above, and outputs those on an unillustrated indicator or the like.

Next, operations of the jitter measuring apparatus 20 having the above-described configuration will be described.

Due to the signal to be measured C being converted into a digital signal sequence x(n) by sampling thereof by the analog-to-digital converter 21, and being input to the orthogonal signal generating unit 22, two signals I(n), Q(n) orthogonal to one another are obtained with respect to that signal sequence x(n).

These two orthogonal signals I(n), Q(n) are input to the instantaneous phase calculating unit 23, and an instantaneous phase Θ(n) determined by the two orthogonal signals I(n), Q(n) is determined within a range (for example, a predetermined range from −π to π) between a lower limit phase value set in advance (for example, −π) and an upper limit phase value set in advance (for example, π).

As shown in FIG. 4A, this instantaneous phase θ(n) repeats a variation in which after increasing from nearly an initial phase θc up to nearly π as n(=1, 2, . . . ) increases while receiving a fluctuation by jitter, the instantaneous phase Θ(n) varies to nearly −π discontinuously, and increases again.

Further, although not illustrated, in contrast to the case of FIG. 4A, there are cases in which the instantaneous phase Θ(n) varies discontinuously to nearly π again under the effect of jitter immediately after the varying discontinuously from nearly π to nearly −π.

On the other hand, at the differential value detecting unit 24 which has received the instantaneous phase Θ(n), as shown in FIG. 4B, the differential value ΔΘ(n) with respect to the instantaneous phase Θ(n) is successively calculated.

This differential value ΔΘ(n) with respect to the instantaneous phase Θ(n) is to have a discontinuous point discontinuously varying to a value less than −π when the instantaneous phase Θ(n) has discontinuously varied, for example, from nearly π to nearly −π.

Further, although not illustrated, in contrast to the case of FIG. 4B, when the instantaneous phase Θ(n) discontinuously varies from nearly −π to nearly π, the differential value ΔΘ(n) with respect to the instantaneous phase Θ(n) is to have a discontinuous point discontinuously varying to a value greater than π.

Such a discontinuous point of the differential value ΔΘ(n) with respect to the instantaneous phase Θ(n) is corrected by the differential value correcting unit 25, for example, as shown in FIG. 4C.

FIG. 4C is a case in which the differential value correcting unit 25 has a configuration shown in FIG. 2A described above.

That is, at the differential value correcting unit 25 shown in FIG. 2A, when the differential value ΔΘ(n) with respect to the instantaneous phase Θ(n) is within a predetermined range (for example, −π≦ΔΘ(n)≦π), because a discontinuous point is not detected by the discontinuous point detecting unit 25*a*, the differential value ΔΘ(n) with respect to the instantaneous phase Θ(n) is output as a corrected differential value Δθ(n) as is from the continuity insuring unit 25*b*.

Then, at this differential value correcting unit 25, when the instantaneous phase Θ(n) discontinuously varies from nearly π to nearly −π, and the differential value ΔΘ(n) with respect to the instantaneous phase Θ(n) is made smaller than −π, it is detected as a discontinuous point by the discontinuous point detecting unit 25*a*, and due to the differential value ΔΘ(n) with respect to the instantaneous phase Θ(n) being corrected so as to add by 2π corresponding to a width of the predetermined range by the continuity insuring unit 25*b* on the basis thereof, the continuity of the differential value Δθ(n) with respect to the instantaneous phase Θ(n) is insured and output from the continuity insuring unit 25*b*.

Then, at this differential value correcting unit 25, when the instantaneous phase Θ(n) discontinuously varies from nearly −π to nearly π, and the differential value ΔΘ(n) with respect to the instantaneous phase Θ(n) is made larger than π, it is detected as a discontinuous point by the discontinuous point detecting unit 25*a*, and due to the differential value ΔΘ(n) with respect to the instantaneous phase Θ(n) being corrected so as to subtract by 2π by the continuity insuring unit 25*b* on the basis thereof, the continuity of the differential value Δθ(n) with respect to the instantaneous phase Θ(n) is insured and output from the continuity insuring unit 25*b*.

Further, in the case of the differential value correcting unit 25 shown in FIG. 2B, when the differential value ΔΘ(n) with respect to the instantaneous phase Θ(n) is within a predetermined range (for example, −π≦ΔΘ(n)≦π), because a discontinuous point is not detected by the discontinuous point detecting unit 25*a*, the differential value ΔΘ(n) with respect to the instantaneous phase Θ(n) is output as a corrected differential value Δθ(n) as is from the discontinuous point eliminating unit 25c.

Then, at this differential value correcting unit 25, when the instantaneous phase Θ(n) discontinuously varies from nearly π to nearly −π, and the differential value ΔΘ(n) with respect to the instantaneous phase Θ(n) is made smaller than −π, it is detected as a discontinuous point by the discontinuous point detecting unit 25a, and a differential value Δθ(n) corrected such that the differential value ΔΘ(n) of the instantaneous phase Θ(n) is eliminated as a discontinuous point by the discontinuous point eliminating unit 25c on the basis thereof is output from the discontinuous point eliminating unit 25c.

Then, at this differential value correcting unit 25, when the instantaneous phase Θ(n) discontinuously varies from nearly −π to nearly π, and the differential value ΔΘ(n) with respect to the instantaneous phase Θ(n) is made larger than π, it is detected as a discontinuous point by the discontinuous point detecting unit 25a, and a differential value Δθ(n) corrected such that the differential value ΔΘ(n) at that time is eliminated as a discontinuous point by the discontinuous point eliminating unit 25c on the basis thereof is output from the discontinuous point eliminating unit 25c.

In this way, when there is the discontinuous point in a differential value ΔΘ(n), the differential value correcting unit 25 shown in FIG. 2B is applied to jitter measurement in which such that it does not much matter even if the differential value Δθ(n) output from the discontinuous point eliminating unit 25c of the discontinuity point correcting unit 25 is made partially to be a so-called toothless state by eliminating the discontinuous point by the discontinuous point eliminating unit 25c.

Further, in the case of the differential value correcting unit 25 shown in FIG. 2C, when the differential value ΔΘ(n) with respect to the instantaneous phase Θ(n) is within a predetermined range (for example, −π≦ΔΘ(n)≦π), because a discontinuous point is not detected by the discontinuous point detecting unit 25a, the differential value ΔΘ(n) with respect to the instantaneous phase Θ(n) is output as is as a corrected differential value Δθ(n) from the discontinuous point interpolating unit 25b.

Then, at this differential value correcting unit 25, when the instantaneous phase Θ(n) discontinuously varies from nearly π to nearly −π, and the differential value ΔΘ(n) with respect to the instantaneous phase Θ(n) is made smaller than −π, it is detected as a discontinuous point by the discontinuous point detecting unit 25a, and due to the differential value ΔΘ(n) with respect to the instantaneous phase Θ(n) being eliminated as a discontinuous point by the discontinuous point interpolating unit 25b on the basis thereof, and due to the eliminated portion being corrected so as to linearly interpolate on the basis of, for example, the front and rear differential values ΔΘ(n−1) and ΔΘ(n+1) with respect to the instantaneous phase Θ(n) at that time, substantially, the continuity of the differential value ΔΘ(n) is insured and output from the discontinuous point interpolating unit 25b.

Further, at this differential value correcting unit 25, when the instantaneous phase Θ(n) discontinuously varies from nearly −π to nearly π, and the differential value ΔΘ(n) with respect to the instantaneous phase Θ(n) is made larger than π, it is detected as a discontinuous point by the discontinuous point detecting unit 25a, and due to the differential value ΔΘ(n) with respect to the instantaneous phase Θ(n) being eliminated as a discontinuous point by the discontinuous point interpolating unit 25b on the basis thereof, and due to the eliminated portion being corrected so as to linearly interpolate on the basis of, for example, the differential values ΔΘ(n−1) and ΔΘ(n+1) with respect to the instantaneous phase Θ(n) before and after that time, substantially, the continuity of the differential value Δθ(n) is insured and output from the discontinuous point interpolating unit 25b.

Note that, the differential value correcting unit 25 shown in FIG. 2A, as a case in which the lower limit and the upper limit of the range dependent on the lower limit phase value and the upper limit phase value are made equal to or approximately equal to the lower limit phase value and the upper limit phase value, when the range dependent on the lower limit phase value −π and the upper limit phase value π is over ½ of the difference (2π) between the lower limit phase value −π and the upper limit phase value π (i.e., π), may have the discontinuous point detecting unit 25a which detects a discontinuous point of the differential value ΔΘ(n) with respect to the instantaneous phase Θ(n) detected at the differential value detecting unit 24, and the continuity insuring unit 25b which insures the continuity of the differential value Δθ(n) by outputting a differential value Δθ(n) in which the discontinuous point of the differential value ΔΘ(n) of the instantaneous phase Θ(n) detected by the discontinuous point detecting unit 25a has been corrected, with respect to the differential value ΔΘ(n) of the instantaneous phase Θ(n) detected by the differential value detecting unit 24.

Further, the differential value correcting unit 25 shown in FIG. 2B, as a case in which the lower limit and the upper limit of the range dependent on the lower limit phase value and the upper limit phase value are made equal to or approximately equal to the lower limit phase value and the upper limit phase value, when the range dependent on the lower limit phase value −π and the upper limit phase value π is over ½ of the difference (2π) between the lower limit phase value −π and the upper limit phase value π (i.e., π), may have the discontinuous point detecting unit 25a which detects a discontinuous point of the differential value ΔΘ(n) with respect to the instantaneous phase Θ(n) detected at the differential value detecting unit 24, and the discontinuous point eliminating unit 25c which eliminates the discontinuous point of the differential value ΔΘ(n) of the instantaneous phase Θ(n) detected by the discontinuous point detecting unit 25a with respect to the differential value ΔΘ(n) of the instantaneous phase Θ(n) detected by the differential value detecting unit 24 and outputs the eliminated differential value ΔΘ(n).

Further, the differential value correcting unit 25 shown in FIG. 2C, as a case in which the lower limit and the upper limit of the range dependent on the lower limit phase value and the upper limit phase value are made equal to or approximately equal to the lower limit phase value and the upper limit phase value, when the range dependent on the lower limit phase value −π and the upper limit phase value π is over ½ of the difference (2π) between the lower limit phase value −π and the upper limit phase value π (i.e., π), may have the discontinuous point detecting unit 25a which detects a discontinuous point of the differential value ΔΘ(n) of the instantaneous phase Θ(n) detected at the differential value detecting unit 24, and the discontinuous point interpolating unit (25d) which substantially insures the continuity of the differential value Δθ(n) by eliminating the discontinuous point of the differential value ΔΘ(n) of the instantaneous phase Θ(n) detected by the discontinuous point detecting unit 25a, with respect to the differential value ΔΘ(n) of the instantaneous phase Θ(n) detected by the differential value detecting unit 24 and by interpolating the eliminated portion by, for example, a linear interpolation as described above, or the like, and by outputting the interpolated differential value ΔΘ(n).

Figure 4D:
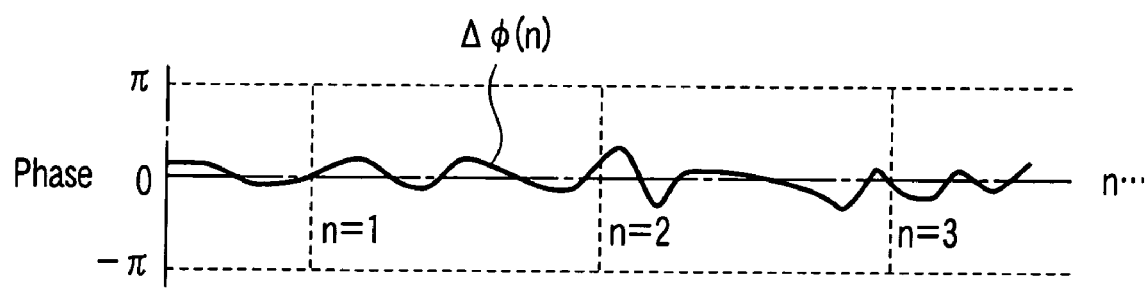
FIG. 4D is a signal waveform chart shown in order to explain operations of the jitter measuring apparatus and the jitter measuring method according to the embodiment of FIG. 1.

Next, the offset component eliminating unit 26, as described above, outputs a differential value Δφ(n) from which the offset component Dc is eliminated to the integration unit 27, as shown in FIG. 4D, by eliminating an offset component Dc corresponding to 2π(fc/fs) superposed upon a differential value ΔΘ(n) corrected, for example, so as to insure the continuity by the differential value interpolating unit 25.

That is, in the case of the offset component eliminating unit 26 shown in FIG. 3A, provided that a sampling frequency fs of the analog-to-digital converter 21 and a frequency fc of the signal to be measured C have been already known, a value of the offset component 2π(fc/fs) is determined and stored in the memory 26a in advance of jitter measurement, and at the time of jitter measurement, the offset component Dc can be eliminated by using a configuration in which a stored value in the memory 26a is subtracted from the differential value ΔΘ(n) by the subtraction unit 26b.

Further, in the case of the offset component eliminating unit 26 shown in FIG. 3B, when a frequency fc of the signal to be measured C and a sampling frequency fs have been unknown, and a value of the offset component 2π(fc/fs) is obscure, as shown in 3B, a mean value H of the differential value ΔΘ(n) is determined by the mean value calculating unit 26c in advance of jitter measurement, and the offset component Dc can be eliminated by subtracting the mean value H from the differential value ΔΘ(n) of the instantaneous phase input at the time of jitter measurement by the subtraction unit 26b.

Further, in the case of the offset component eliminating unit 26 shown in FIG. 3C, provided that a lower limit frequency fj (for example, 10 Hz) of the jitter component which is an object to be detected is designated, as shown in FIG. 3C, by using a high-pass filter 26d having a frequency equal to or approximately equal to the lower limit frequency fj of the jitter component which is the object to be detected as a cutoff frequency, the offset component Dc can be eliminated from the differential value ΔΘ(n) of the instantaneous phase input at the time of jitter measurement.

Figure 4E:
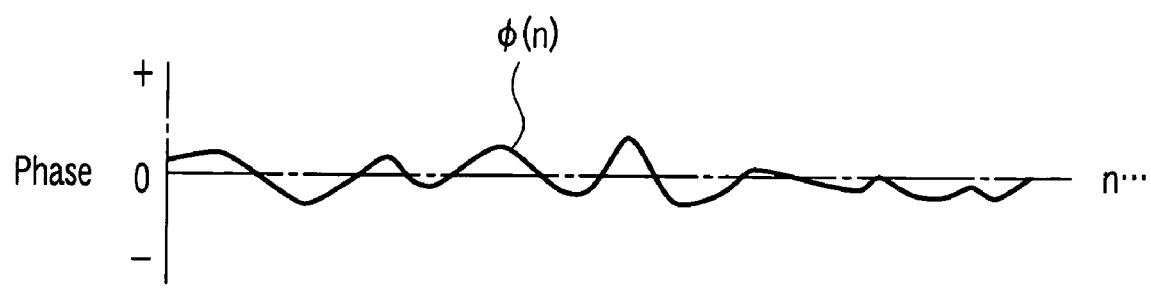
FIG. 4E is a signal waveform chart shown in order to explain operations of the jitter measuring apparatus and the jitter measuring method according to the embodiment of FIG. 1.
Figure 5:
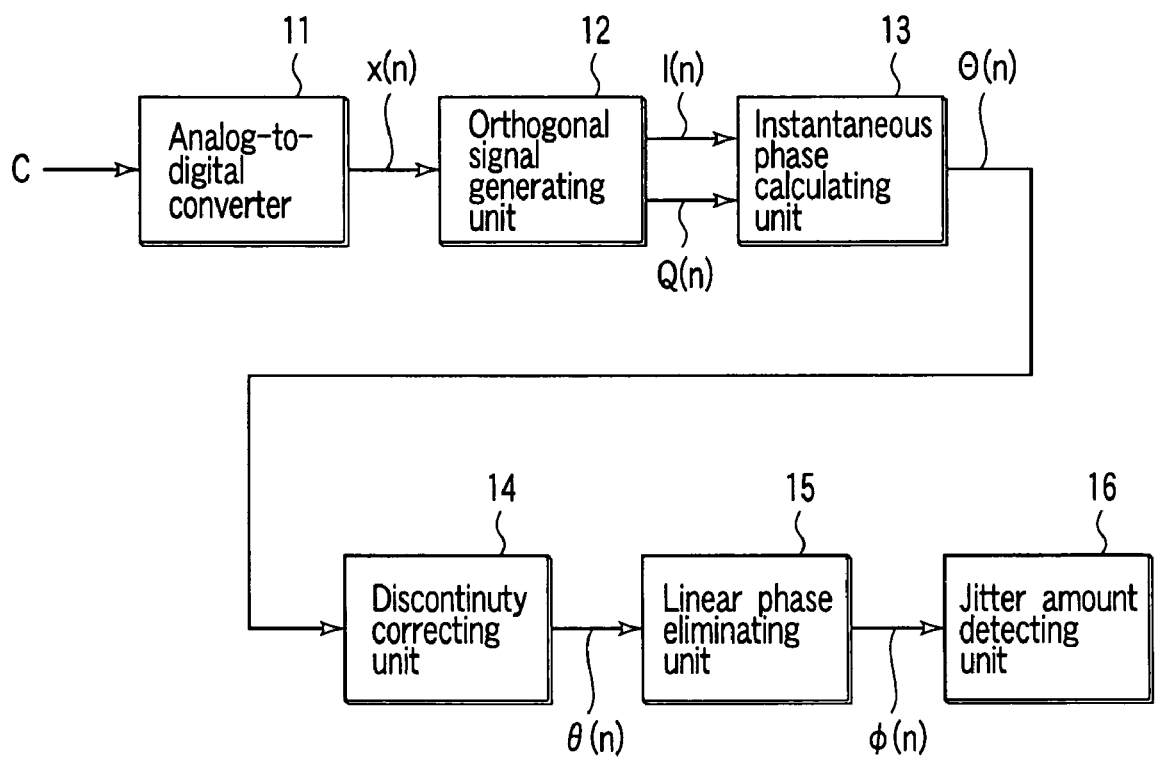
FIG. 5 is a block diagram showing a configuration of a conventional jitter measuring apparatus.
Figure 6A:
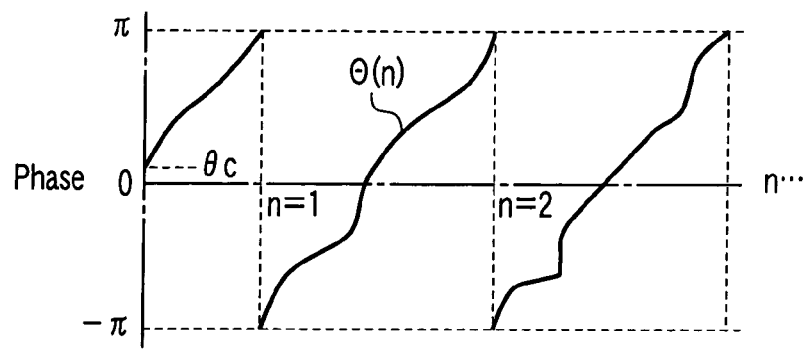
FIG. 6A is a signal waveform chart shown in order to explain operations of the conventional jitter measuring apparatus.
Figure 6B:
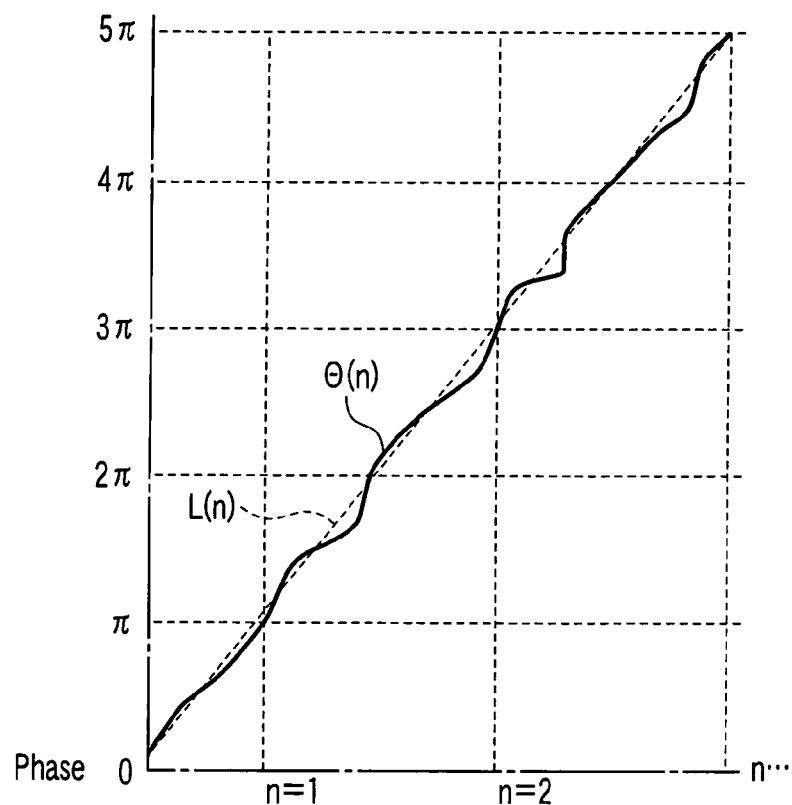
FIG. 6B is a signal waveform chart shown in order to explain operations of the conventional jitter measuring apparatus.
Figure 6C:
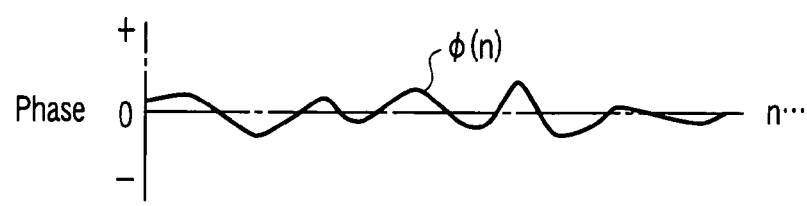
FIG. 6C is a signal waveform chart shown in order to explain operations of the conventional jitter measuring apparatus.

Then, the integration unit 27 determines a jitter component φ(n) of the signal to be measured C as shown in FIG. 4E by integrating the differential value Δφ(n) from which the offset component Dc has been eliminated by the offset component eliminating unit 26, and outputs this jitter component φ(n) of the signal to be measured C to the jitter amount detecting unit 28.

The jitter amount detecting unit 28 determines, with respect to the jitter component φ(n) output from the integration unit 27, a maximum amplitude value (p-p value), a root-mean-square value (rms), a histogram or a spectrum thereof, and outputs to indicate those on an indicator or the like.

As described above, in the jitter measuring apparatus and the jitter measuring method in the present embodiment, an instantaneous phase Θ(n) determined based on the two orthogonal signals I(n), Q(n) generated from the signal to be measured C is determined within a range from −π to π (predetermined range), and a differential value ΔΘ(n) of the instantaneous phase Θ(n) is calculated, and a predetermined correction such as, for example, insuring the continuity, or the like is carried out with respect to the differential value ΔΘ(n) of the instantaneous phase Θ(n), and an offset component Dc is eliminated from the differential value ΔΘ(n) corrected, for example, so as to insure the continuity, and a jitter component φ(n) of the signal to be measured C is determined by integrating the differential value Δφ(n) from which the offset component Dc has been eliminated.

Therefore, as the number of arithmetic bits at the respective portions and the respective stages, the number of bits (for example, 16+1 bits) for obtaining the differential value ΔΘ(n) from −2π to 2π (a range which is double the predetermined range at the time of determining an instantaneous phase) with a necessary accuracy is sufficient, and jitter measurement over a long time, for example, several minutes or more is made possible without limiting to the number of arithmetic bits, and moreover, substantially, without limiting the maximum measurement time for jitter measurement.

Note that, in the above-described embodiment, the instantaneous phase Θ(n) is determined within a range from −90 to π. However, this range is not limited from −π to π, and may be arbitrarily set according to a magnitude of an estimated jitter.

For example, in a case of measuring a little jitter, the instantaneous phase Θ(n) may be determined within a range from −π/2 to π/2.

In this case, in the above-described formula (7) is made to be

| | | |
|---|---|---|
| ΔΘ(n) = ΔΘ(n) | (−π/2 ≦ ΔΘ(n) ≦ π/2) | (10) |
| ΔΘ(n) = ΔΘ(n) + π | (−π/2 > ΔΘ(n)) | |
| ΔΘ(n) = ΔΘ(n) − π | (ΔΘ(n) > π/2) | |

Further, in the above-described embodiment, the case in which the signal to be measured C is an analog signal was described. However, when a jitter of a signal to be measured which has been digitized is measured, it is recommended that the analog-to-digital converter 21 be omitted, and the digitized signal to be measured be directly input to the orthogonal signal generating unit 22.

Further, in the above-described embodiment, the case in which the respective portions and the respective stages are realized by a hardware configuration was described. However, it is possible to realize by software structures according to various computers including CPUs.

In addition thereto, with respect to the above-described embodiment, it goes without saying that various modifications and applications are possible within a range which does not deviate from the gist of the present invention.

Accordingly, as described above in detail, according to the present invention, a jitter measuring apparatus and a jitter measuring method can be provided in which the problems which the above-described conventional art has are solved, and a high resolution and a long time measurement are made compatible, and jitter measurement can be highly accurately carried out substantially without limiting the maximum measurement time.

The invention claimed is:

1. A jitter measuring apparatus comprising:
   an orthogonal signal generating unit which converts a signal to be measured into two orthogonal signals which are two signals whose phases are orthogonal to one another;
   an instantaneous phase calculating unit which calculates an instantaneous phase based on the two orthogonal signals converted by the orthogonal signal generating unit within a range between a lower limit phase value set in advance and an upper limit phase value set in advance;

a differential value detecting unit which detects a differential value of the instantaneous phase calculated by the instantaneous phase calculating unit;

a differential value correcting unit which corrects the differential value of the instantaneous phase, and which outputs a corrected differential value when the differential value of the instantaneous phase detected by the differential value detecting unit is over the range dependent on the lower limit phase value and the upper limit phase value;

an offset component eliminating unit which eliminates an offset component included in the corrected differential value from the corrected differential value output by the differential value correcting unit, and which outputs a differential value from which the offset component has been eliminated; and an integration unit which determines a jitter amount of the signal to be measured by integrating the differential value which is output by the offset component eliminating unit, and from which the offset component has been eliminated.

2. The jitter measuring apparatus according to claim 1, wherein a lower limit and an upper limit of the range dependent on the lower limit phase value and the upper limit phase value are respectively equal to or approximately equal to the lower limit phase value and the upper limit phase value.

3. The jitter measuring apparatus according to claim 1 or 2, wherein the differential value correcting unit has a discontinuous point detecting unit which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a continuity insuring unit which insures continuity of the differential value of the instantaneous phase by correcting a discontinuous point of the differential value of the instantaneous phase detected by the discontinuous point detecting unit with respect to the differential value of the instantaneous phase detected by the differential value detecting unit, and outputting the corrected differential value.

4. The jitter measuring apparatus according to claim 1 or 2, wherein the differential value correcting unit has a discontinuous point detecting unit which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a discontinuous point eliminating unit which eliminates the discontinuous point of the differential value of the instantaneous phase detected by the discontinuous point detecting unit with respect to the differential value of the instantaneous phase detected by the differential value detecting unit and outputs the eliminated differential value.

5. The jitter measuring apparatus according to claim 1 or 2, wherein the differential value correcting unit has a discontinuous point detecting unit which detects the differential value of the instantaneous phase as a discontinuous point of the differential value of the instantaneous phase when the differential value of the instantaneous phase detected by the differential value detecting unit is over the range dependent on the lower limit phase value and the upper limit phase value, and a discontinuous point interpolating unit which substantially insures continuity of the differential value of the instantaneous phase by eliminating the discontinuous point of the differential value of the instantaneous phase detected by the discontinuous point detecting unit with respect to the differential value of the instantaneous phase detected by the differential value detecting unit and interpolating the eliminated portion and outputting the interpolated differential value.

6. The jitter measuring apparatus according to claim 1, wherein the offset component eliminating unit has a memory in which a value determined by an operation of $2\pi(fc/fs)$ showing the offset component is stored in advance when a frequency fc of the signal to be measured and a sampling frequency fs for sampling the signal to be measured have been already known, and a subtraction unit which subtracts the value showing the offset component stored in the memory from the corrected differential value output by the differential value correcting unit.

7. The jitter measuring apparatus according to claim 1, wherein the offset component eliminating unit has a mean value calculating unit which determines a mean value of the corrected differential value output by the differential value correcting unit as an offset component in advance when a frequency fc of the signal to be measured and a sampling frequency fs for sampling the signal to be measured have been unknown, and a subtraction unit which subtracts the mean value of the corrected differential value serving as the offset component determined by the mean value calculating unit from the corrected differential value output by the differential value correcting unit.

8. The jitter measuring apparatus according to claim 1, wherein, when a lower limit frequency fj of a jitter component which is an object to be detected is designated, the offset component eliminating unit includes a high-pass filter which has a frequency equal to or approximately equal to the lower limit frequency fj of the jitter component which is the object to be detected as a cutoff frequency for eliminating the offset component from the corrected differential value output by the differential value correcting unit.

9. The jitter measuring apparatus according to claim 1, wherein, given that a digital signal sequence of the signal to be measured is x(n), a frequency and an amplitude of the signal to be measured are respectively fc and Ac, a sampling frequency for sampling the signal to be measured is fs, and an initial phase and a jitter of the signal to be measured are respectively θc and φ(n), n=0,1,2, . . . , and when I(n), Q(n) serving as the two orthogonal signals are respectively expressed by $$I(n)=x(n)=Ac\cdot\cos[2\pi(fc/fs)n+\theta c+\phi(n)],$$

$$Q(n)=Ac\cdot\sin[2\pi(fc/fs)n+\theta c+\phi(n)],$$

and Θ(n) serving as the instantaneous phase is expressed by $$\Theta(n) = \tan^{-1}[Q(n)/I(n)]$$
$$= 2\pi(fc/fs)n + \theta c + \phi(n),$$

the instantaneous phase calculating unit calculates Θ(n) serving as the instantaneous phase determined by an operation of the $\tan^{-1}[Q(n)/I(n)]$ within a range from $-\pi$ to $\pi$, or $-\pi/2$ to $\pi/2$ as a range between the lower limit phase value set in advance and the upper limit phase value set in advance.

10. The jitter measuring apparatus according to claim 9, wherein the differential value detecting unit calculates ΔΘ(n) serving as the differential value of the instantaneous phase calculated by the instantaneous phase calculating unit, by an operation of $$\Delta\Theta(n) = \Theta(n) - \Theta(n-1)$$
$$= 2\pi(fc/fs) + \phi(n) - \phi(n-1)$$

(Where, Θ(n−1)=0, and here, 2π(fc/fs) is a constant and an offset component).

11. The jitter measuring apparatus according to claim 10, wherein the differential value correcting unit carries out arithmetic processing of

| | |
|---|---|
| Δθ(n) = ΔΘ(n) | (−π ≤ ΔΘ(n) ≤ π), |
| Δθ(n) = ΔΘ(n) + 2π | (−π > ΔΘ(n)), |
| Δθ(n) = ΔΘ(n) − 2π | (ΔΘ(n) > π) |
| or | |
| Δθ(n) = ΔΘ(n) | (−π/2 ≤ ΔΘ(n) ≤ π/2), |
| Δθ(n) = ΔΘ(n) + π | (−π/2 > ΔΘ(n)), |
| Δθ(n) = ΔΘ(n) − π | (ΔΘ(n) > π/2) | with respect to ΔΘ(n) serving as the differential value of the instantaneous phase in order to calculate Δθ(n) serving as the corrected differential value corrected so as to insure continuity by correcting the discontinuous point of ΔΘ(n) serving as the differential value of the instantaneous phase calculated by the instantaneous phase calculating unit.

12. The jitter measuring apparatus according to claim 11, wherein the offset component eliminating unit eliminates the offset component 2π(fc/fs) from Δθ(n) serving as the corrected differential value corrected so as to insure the continuity by the differential value correcting unit, and outputs $$\Delta\phi(n)=\phi(n)-\phi(n-1)$$

as Δφ(n) serving as the differential value from which the offset component has been eliminated to the integration unit.

13. The jitter measuring apparatus according to claim 12, wherein the integration unit
carries out a following integration
U(n)=ΣΔφ(i) (Where, the symbol Σ denotes the sum total of i=0,1,2, . . . , n, and here, provided that U(n) is theoretically expanded, it is made to be $$U(n)=[\phi(0)-\phi(-1)]+[\phi(1)-\phi(0)]+[\phi(2)-\phi(1)]+ \ldots + [\phi(n)-\phi(n-1)]=\phi(n)-\phi(n-1)$$

with respect to Δφ(n) serving as the differential value which is output by the offset component eliminating unit, and from which the offset component has been eliminated, and here, given that φ(−1)=0, an integrated result U(n) is to express a jitter component φ(n) of the signal to be measured, and outputs the integrated result U(n) as the jitter component φ(n) of the signal to be measured.

14. A jitter measuring method comprising:

a step of converting a signal to be measured into two orthogonal signals which are two signals whose phases are orthogonal to one another;

a step of calculating an instantaneous phase based on the two orthogonal signals converted by the step of converting into the two orthogonal signals within a range between a lower limit phase value set in advance and an upper limit phase value set in advance;

a step of detecting a differential value of the instantaneous phase calculated by the step of calculating the instantaneous phase;

a step of correcting the differential value of the instantaneous phase, and outputting a corrected differential value when the differential value of the instantaneous phase detected by the step of detecting the differential value of the instantaneous phase is over the range dependent on the lower limit phase value and the upper limit phase value;

a step of eliminating an offset component included in the corrected differential value from the corrected differential value output by the step of correcting the differential value of the instantaneous phase, and outputting a differential value from which the offset component has been eliminated;

a step of determining a jitter amount of the signal to be measured by integrating the differential value which is output by the step of eliminating the offset component, and from which the offset component has been eliminated; and a step of outputting the determined jitter amount to an indicator.

15. The jitter measuring method according to claim 14, wherein a lower limit and an upper limit of the range dependent on the lower limit phase value and the upper limit phase value are respectively equal to or approximately equal to the lower limit phase value and the upper limit phase value.

16. The jitter measuring method according to claim 14 or 15, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of insuring continuity of the differential value of the instantaneous phase by correcting the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and outputting the corrected differential value.

17. The jitter measuring method according to claim 14 or 15, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of eliminating the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and outputting the eliminated differential value.

18. The jitter measuring method according to claim 14 or 15, wherein the step of correcting the differential value of the instantaneous phase has a step of detecting the differential value of the instantaneous phase as a discontinuous point of the differential value of the instantaneous phase when the differential value of the instantaneous phase detected by the step of detecting the differential value of the instantaneous phase is over the range dependent on the lower limit phase value and the upper limit phase value, and a step of substantially insuring continuity of the differential value of the instantaneous phase by eliminating the discontinuous point of the differential value of the instantaneous phase detected by the step of detecting the discontinuous point of the differential value of the instantaneous phase with respect to the differential value of the instantaneous phase detected by the step of detecting the differential value of the instantaneous phase, and interpolating the eliminated portion, and outputting the interpolated differential value.

19. The jitter measuring method according to claim 14, wherein the step of eliminating the offset component has a step of storing a value determined by an operation of $2\pi(fc/fs)$ showing the offset component in a memory in advance when a frequency fc of the signal to be measured and a sampling frequency fs for sampling the signal to be measured have been already known, and a step of subtracting the value showing the offset component stored in the memory from the corrected differential value output by the step of correcting the differential value of the instantaneous phase.

20. The jitter measuring method according to claim 14, wherein the step of eliminating the offset component has a step of determining a mean value of the corrected differential value output by the step of correcting the differential value of the instantaneous phase as an offset component in advance when a frequency fc of the signal to be measured and a sampling frequency fs for sampling the signal to be measured have been unknown, and a step of subtracting the mean value of the corrected differential value serving as the offset component determined by the step of determining the mean value of the corrected differential value, from the corrected differential value output by the step of correcting the differential of the instantaneous phase.

21. The jitter measuring method according to claim 14, wherein, when a lower limit frequency fj of a jitter component which is an object to be detected is designated, the step of eliminating the offset component uses a high-pass filter which has a frequency equal to or approximately equal to the lower limit frequency fj of the jitter component which is the object to be detected as a cutoff frequency for eliminating the offset component from the corrected differential value output by the step of correcting the differential value of the instantaneous phase.

22. The jitter measuring method according to claim 14, wherein, given that a digital signal sequence of the signal to be measured is x(n), a frequency and an amplitude of the signal to be measured are respectively fc and Ac, a sampling frequency for sampling the signal to be measured is fs, and an initial phase and a jitter of the signal to be measured are respectively θc and φ(n), n=0,1,2, . . . , and when I(n), Q(n) serving as the two orthogonal signals are respectively expressed by $$I(n)=x(n)=Ac \cdot \cos[2\pi(fc/fs)n+\theta c+\phi(n)],$$

$$Q(n)=Ac \cdot \sin[2\pi(fc/fs)n+\theta c+\phi(n)],$$

and Θ(n) serving as the instantaneous phase is expressed by $$\Theta(n) = \tan^{-1}[Q(n)/I(n)]$$
$$= 2\pi(fc/fs)n + \theta c + \phi(n),$$

the step of calculating the instantaneous phase calculates Θ(n) serving as the instantaneous phase determined by an operation of the $\tan^{-1}[Q(n)/I(n)]$ within a range from $-\pi$ to $\pi$, or $-\pi/2$ to $\pi/2$ as a range between the lower limit phase value set in advance and the upper limit phase value set in advance.

23. The jitter measuring method according to claim 22, wherein the step of detecting the differential value of the instantaneous phase calculates ΔΘ(n) serving as the differential value of the instantaneous phase calculated by the step of calculating the instantaneous phase, by an operation of $$\Delta\Theta(n) = \Theta(n) - \Theta(n-1)$$
$$= 2\pi(fc/fs) + \phi(n) - \phi(n-1)$$

(Where, Θ(n−1)=0, and here, $2\pi(fc/fs)$ is a constant and an offset component).

24. The jitter measuring method according to claim 23, wherein the step of correcting the differential value of the instantaneous phase carries out arithmetic processing of

| | |
|---|---|
| $\Delta\Theta(n) = \Delta\Theta(n)$ | $(-\pi \leq \Delta\Theta(n) \leq \pi)$, |
| $\Delta\Theta(n) = \Delta\Theta(n) + 2\pi$ | $(-\pi > \Delta\Theta(n))$, |
| $\Delta\Theta(n) = \Delta\Theta(n) - 2\pi$ | $(\Delta\Theta(n) > \pi)$ |
| or | |
| $\Delta\Theta(n) = \Delta\Theta(n)$ | $(-\pi/2 \leq \Delta\Theta(n) \leq \pi/2)$, |
| $\Delta\Theta(n) = \Delta\Theta(n) + \pi$ | $(-\pi/2 > \Delta\Theta(n))$, |
| $\Delta\Theta(n) = \Delta\Theta(n) - \pi$ | $(\Delta\Theta(n) > \pi/2)$ | with respect to $\Delta\Theta(n)$ serving as the differential value of the instantaneous phase in order to calculate $\Delta\theta(n)$ serving as the corrected differential value corrected so as to insure continuity by correcting a discontinuous point of $\Delta\Theta(n)$ serving as the differential value of the instantaneous phase calculated by the step of calculating the instantaneous phase.

25. The jitter measuring method according to claim 24, wherein the step of eliminating the offset component eliminates the offset component $2\pi(fc/fs)$ from $\Delta\theta(n)$ serving as the corrected differential value corrected so as to insure the continuity by the step of correcting the differential value, and outputs $$\Delta\phi(n)=\phi(n)-\phi(n-1)$$

as $\Delta\phi(n)$ serving as the differential value from which the offset component has been eliminated.

26. The jitter measuring method according to claim 25, wherein the step of integrating the differential value from which the offset component has been eliminated carries out a following integration $U(n)=\Sigma\Delta\phi(i)$ (Where, the symbol $\Sigma$ denotes the sum total of i=0,1,2, . . . , n, and here, provided that $U(n)$ is theoretically expanded, it is made to be $$U(n)-[\phi(0)-\phi(-1)]+[\phi(1)-\phi(0)]+[\phi(2)-\phi(1)]+ \ldots + [\phi(n)-\phi(n-1)]=\phi(n)-\phi(n-1)$$

with respect to $\Delta\phi(n)$ serving as the differential value which is output by the step of eliminating the offset component, and from which the offset component has been eliminated, and here, given that $\phi(-1)=0$, an integrated result $U(n)$ is to express a jitter component $\phi(n)$ of the signal to be measured, and outputs the integrated result $U(n)$ as the jitter component $\phi(n)$ of the signal to be measured.

* * * * *